(12) United States Patent  (10) Patent No.: US 7,768,118 B2
Yoshida et al. (45) Date of Patent: Aug. 3, 2010

(54) SEMICONDUCTOR DEVICE

(75) Inventors: Hiroshi Yoshida, Chiyoda-ku (JP); Tatsuo Ota, Chiyoda-ku (JP); Nobutake Taniguchi, Chiyoda-ku (JP); Shingo Sudo, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 62 days.

(21) Appl. No.: 12/203,524

(22) Filed: Sep. 3, 2008

(65) Prior Publication Data
US 2009/0321900 A1 Dec. 31, 2009

(30) Foreign Application Priority Data
Jun. 26, 2008 (JP) ............... 2008-166991

(51) Int. Cl.
*H01L 23/52* (2006.01)
*H01L 23/48* (2006.01)
*H01L 23/495* (2006.01)

(52) U.S. Cl. .................. 257/691; 257/692; 257/690; 257/693; 257/E23.043

(58) Field of Classification Search ................ 257/691, 257/690, 692, 693, E23.043
See application file for complete search history.

(56) References Cited
U.S. PATENT DOCUMENTS 5,424,579 A * 6/1995 Arai et al. .................. 257/690
5,705,848 A * 1/1998 Bayerer ..................... 257/500
6,434,008 B1 * 8/2002 Yamada et al. .............. 361/728
7,589,412 B2 * 9/2009 Kashimoto et al. ......... 257/693
2007/0138624 A1 6/2007 Sudo et al.

FOREIGN PATENT DOCUMENTS

| JP | 2002-359334 | 12/2002 |
|---|---|---|
| JP | 2003-264265 | 9/2003 |
| JP | 2007-173272 | 7/2007 |
| JP | 2007-173703 | 7/2007 |

* cited by examiner

*Primary Examiner*—Luan C Thai
(74) *Attorney, Agent, or Firm*—Oblon, Spivak, McClelland, Maier & Neustadt, L.L.P.

(57) ABSTRACT

A semiconductor device has a substrate, a semiconductor element, an electrode lead, and a sealing resin portion. The substrate has a main surface on which a circuit pattern is formed. The semiconductor element has first and second surfaces, and is arranged on the substrate such that the first surface faces the main surface. The electrode lead has one end joined to the circuit pattern and the other end joined by soldering to the second surface. The other end has a plurality of portions divided from each other. The sealing resin portion seals the semiconductor element and the electrode lead. Thus, there can be provided a semiconductor device that has relieved thermal stress at a joining portion of the electrode lead, and therefore is less subject to fatigue failure.

4 Claims, 7 Drawing Sheets

SEMICONDUCTOR DEVICE

BACKGROUND OF THE INVENTION

1. Field of the Invention

The present invention relates to a semiconductor device, and in particular, to a semiconductor device having a sealing resin portion that seals a semiconductor element.

2. Description of the Background Art

Semiconductor devices include a power semiconductor device having a mold resin (sealing resin portion) as disclosed in Japanese Patent Laying-Open No. 2003-264265, for example. According to this publication, the power semiconductor device has a semiconductor element, a metal block, a lead frame, and a casing. The semiconductor element has a surface and a back surface. The metal block is fixed to the back surface of the semiconductor element. The lead frame is fixed by soldering to the surface of the semiconductor element. The semiconductor element, the metal block and the lead frame are integrally-molded by the mold resin of the casing.

The foregoing publication describes that, according to a configuration of this power semiconductor device, the mold resin surrounds the lead frame and the semiconductor element, so that junction therebetween can be strengthened and fatigue failure in a connecting portion of the lead frame is less likely.

In the above power semiconductor device, however, in a case where the semiconductor device generates heat or the usage environment of the semiconductor device changes, fatigue failure due to thermal stress applied to a soldered portion occurs in some cases.

This thermal stress is caused by a difference in linear expansion coefficient between components of the semiconductor device. As an example of the difference in linear expansion coefficient, silicon used for the semiconductor element has a linear expansion coefficient of approximately $2.3 \times 10^{-6}$ (1/K), copper used for an electrode lead has a linear expansion coefficient of approximately $16.7 \times 10^{-6}$, and a sealing resin has a linear expansion coefficient of approximately $18 \times 10^{-6}$. As a result of the thermal stress caused by such difference in linear expansion coefficient, fatigue failure in a joining portion of the lead frame (electrode lead) is more likely.

SUMMARY OF THE INVENTION

The present invention has been made in view of the above problems and an object thereof is to provide a semiconductor device that has relieved thermal stress at a joining portion of an electrode lead, and therefore is less subject to fatigue failure.

A semiconductor device of the present invention has a substrate, a semiconductor element, an electrode lead, and a sealing resin portion. The substrate has a main surface on which a circuit pattern is formed. The semiconductor element has first and second surfaces, and is arranged on the substrate such that the first surface faces the main surface. The electrode lead has one end joined to the circuit pattern and the other end joined by soldering to the second surface. The other end has a plurality of portions divided from each other. The sealing resin portion seals the semiconductor element and the electrode lead.

According to the present invention, the other end of the electrode lead has the plurality of portions divided from each other. Therefore, the plurality of portions can be displaced relative to each other along a direction transverse to a direction of division. This displacement causes thermal stress to be relieved, so that occurrence of fatigue failure in the semiconductor device can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
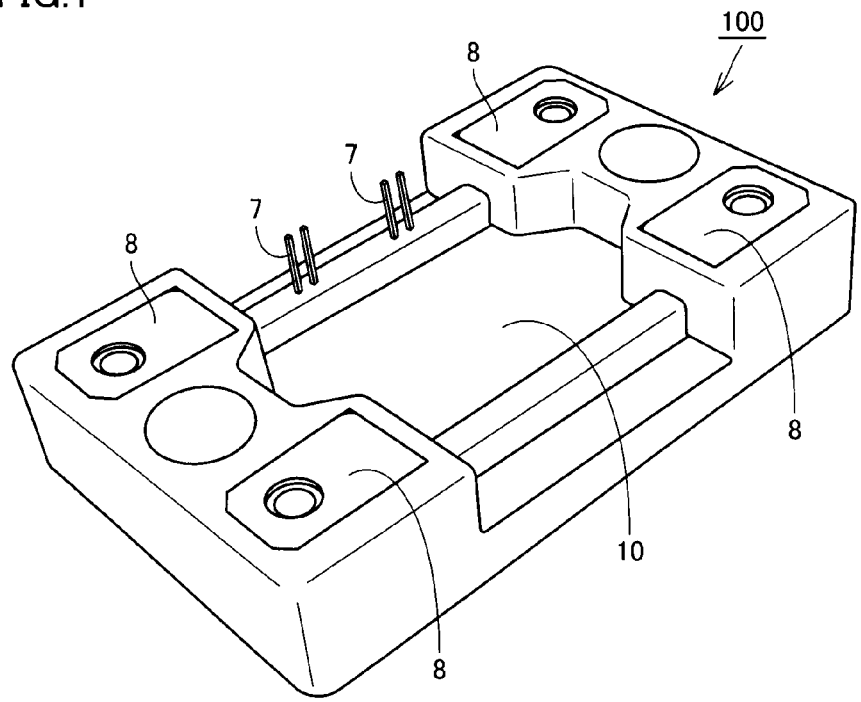
FIG. 1 is a perspective view schematically illustrating a configuration of a semiconductor device in a first embodiment of the present invention.
Figure 2:
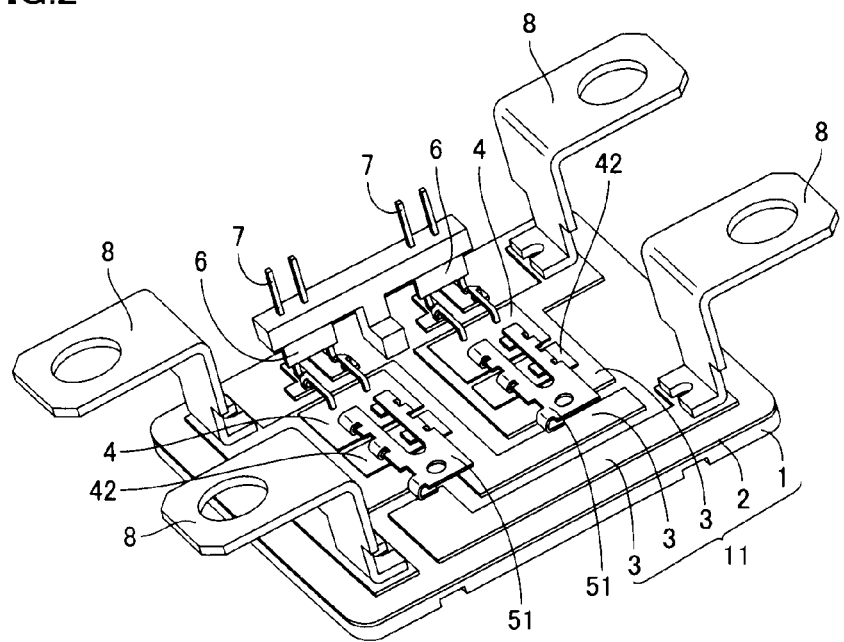
FIG. 2 is a perspective view schematically illustrating an internal configuration of a sealing resin portion of the semiconductor device in the first embodiment of the present invention.

Referring to FIGS. 1-4, a semiconductor device 100 of the present embodiment has a substrate 11, semiconductor elements 4 and 42, an electrode lead 51, a sealing resin portion 10, a signal lead 6, a signal terminal 7, and a main terminal 8.

Each of semiconductor elements 4 and 42 is electrically connected to a circuit pattern 3 by electrode lead 51 and signal lead 6. Furthermore, semiconductor device 100 is connected to the outside by signal terminal 7 and main terminal 8. Among electrical paths formed in such a manner, a path connecting main terminals 8 to each other via semiconductor elements 4 and 42 as well as electrode lead 51 serves as a path for a main current of semiconductor device 100.

Substrate 11 has a base plate 1, an insulating layer 2 and circuit pattern 3. Insulating layer 2 is formed on a main surface of base plate 1. Circuit pattern 3 is formed on insulating layer 2. As a result, substrate 11 has a main surface (a surface shown in FIG. 2) on which circuit pattern 3 is formed. Base plate 1 is made from metal that is a material having high thermal conductivity. This metal includes, for example, copper or aluminum. Insulating layer 2 contains particles made from, for example, AlN, BN, $Al_2O_3$, or silica. Circuit pattern 3 is formed by etching a thin film made from, for example, copper or aluminum. Thus, insulation between each of semiconductor elements 4 and 42 and base plate 1 is ensured, and substrate 11 can efficiently dissipate heat from semiconductor elements 4 and 42.

Sealing resin portion 10 seals semiconductor elements 4 and 42 as well as electrode lead 51. Sealing resin portion 10 is made from, for example, epoxy resin or PPS (polyphenylene sulfide). As a result, the strength of a casing of semiconductor device 100 is ensured, so that semiconductor elements 4 and 42 are more reliably protected.

When semiconductor elements 4 and 42 as well as electrode lead 51 are sealed by filling sealing resin portion 10, filling conditions under which creation of voids between semiconductor elements 4 and 42 and electrode lead 51 is less likely are employed. In other words, process conditions such as a filling position, filling pressure or fluidity as well as properties of the resin material such as viscosity are optimized. A preferable filling position is such that filling starts at the inside of electrode lead 51, and after completion of filling of the area near electrode lead 51, the surrounding area thereof is filled. Furthermore, in a case where sealing resin portion 10 is made from epoxy resin, a filler contained in sealing resin portion 10 is selected in consideration of viscosity and linear expansion coefficient. The viscosity of the resin material is such that it does not obstruct filling, and is set to approximately 4000 Pa·s (a value at 60° C.), for example.

Each of semiconductor elements 4 and 42 has a first surface (a surface facing substrate 11) and a second surface (a surface shown in FIG. 2) facing opposite to the first surface, and is arranged on substrate 11 such that this first surface faces the main surface of substrate 11.

Figure 3:
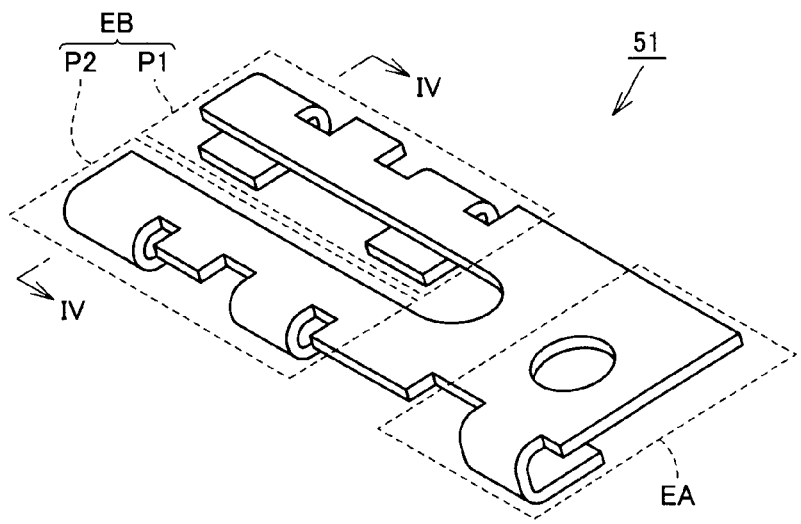
FIG. 3 is a perspective view schematically illustrating a configuration of an electrode lead of the semiconductor device in the first embodiment of the present invention.

Electrode lead 51 has one end EA (a lower right end in FIG. 3) and the other end EB (an upper left end in FIG. 3). One end EA is joined to circuit pattern 3. The other end EB is joined by soldering to the second surface of each of semiconductor elements 4 and 42. The other end EB has a plurality of portions P1 and P2 divided from each other. In other words, the other end EB is divided along a boundary between portion P1 and portion P2 (along a direction of division).

Figure 4:
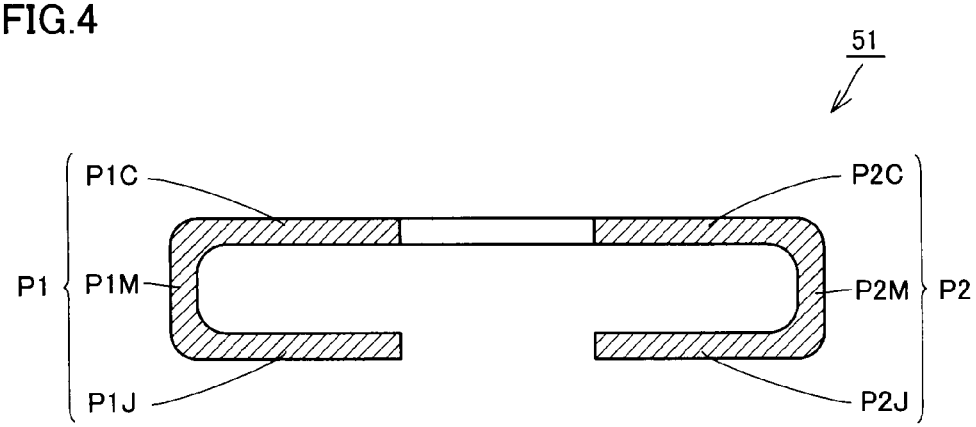
FIG. 4 is a schematic cross-sectional view taken along line IV-IV in FIG. 3.

Portion P1 has a joining portion P1J, a wire portion P1C and a coupling portion P1M as shown in FIG. 4. Joining portion P1J is joined to the second surface (the surface shown in FIG. 2) of each of semiconductor elements 4 and 42. Wire portion P1C is spaced apart from joining portion P1J in a direction orthogonal to the second surface of semiconductor elements 4 and 42 (vertical direction in FIG. 4). Coupling portion P1M couples joining portion P1J to wire portion P1C.

Portion P2 also has a configuration similar to that of portion P1 as shown in FIG. 4. In other words, portion P2 has a joining portion P2J, a wire portion P2C and a coupling portion P2M. Joining portion P2J is joined to the second surface (the surface shown in FIG. 2) of each of semiconductor elements 4 and 42. Wire portion P2C is spaced apart from joining portion P2J in a direction orthogonal to the second surface of semiconductor elements 4 and 42 (vertical direction in FIG. 4). Coupling portion P2M couples joining portion P2J to wire portion P2C.

The thickness and the width of electrode lead 51 are set not to interfere with current capacity. For example, electrode lead 51 is formed of copper material having a thickness of 0.2-0.3 mm. Furthermore, the material of electrode lead 51 preferably has properties of relieving stress at a joining portion between the electrode lead and semiconductor elements 4 and 42. For example, metal having a linear expansion coefficient of not more than $10 \times 10^{-6}$ (1/K) is used.

Next, in comparison with the present embodiment, a modification thereof will be described.

Figure 5:
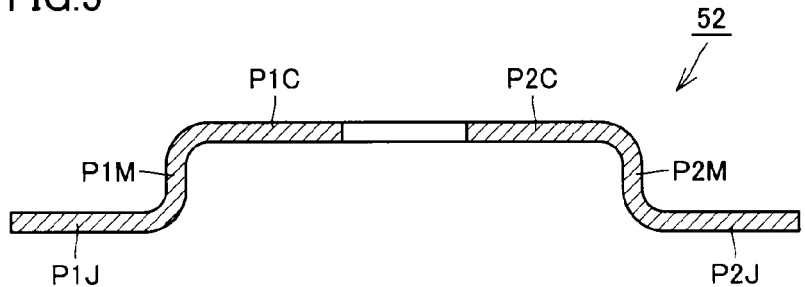
FIG. 5 is a cross-sectional view schematically illustrating a configuration of an electrode lead in a modification of the first embodiment of the present invention.

Referring to FIGS. 4 and 5, above-described electrode lead 51 (in FIG. 4) has joining portion P1J and wire portion P1C on one side (the right side in the figure) of coupling portion P1M, and joining portion P2J and wire portion P2C on one side (the left side in the figure) of coupling portion P2M. On the other hand, an electrode lead 52 (in FIG. 5) that is the modification of the present embodiment has joining portion P1J on the other side (the left side in the figure) of coupling portion P1M, and joining portion P2J on the other side (the right side in the figure) of coupling portion P2M.

According to the present embodiment, the other end EB (in FIG. 3) of electrode lead 51 has the plurality of portions P1 and P2 divided from each other. Therefore, as a result of elastic deformation of electrode lead 51, the plurality of portions P1 and P2 can be displaced relative to each other along a direction transverse to a direction of division (a direction along the boundary between portion P1 and portion P2) (along a direction of line IV-IV in FIG. 3). In other words, portions P1 and P2 can move closer to or away from each other. This causes thermal stress to be further relieved, so that occurrence of fatigue failure in semiconductor device 100 can be suppressed.

Figure 13:
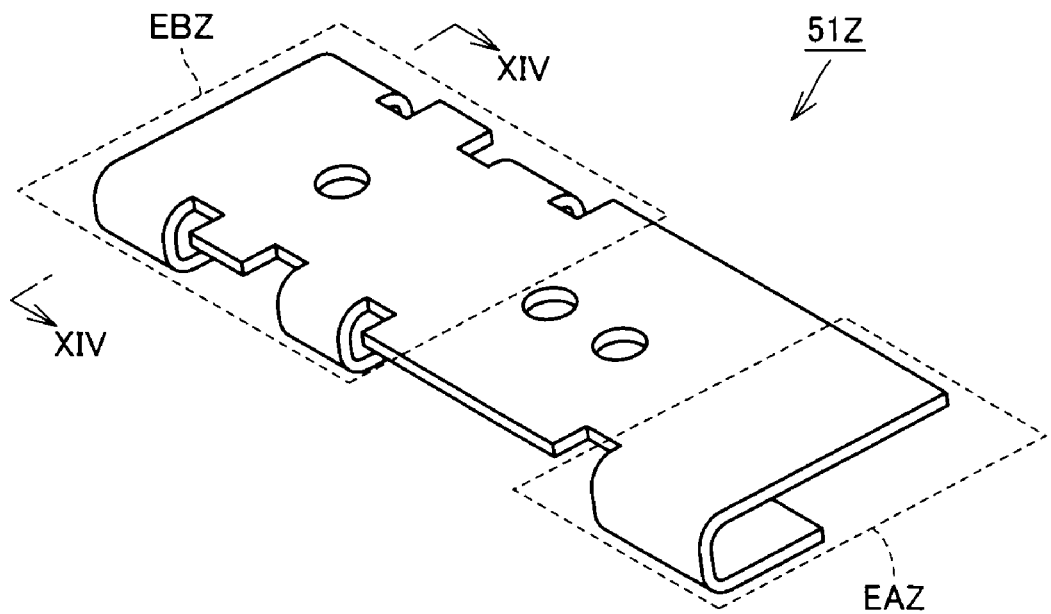
FIG. 13 is a perspective view schematically illustrating a configuration of the conventional electrode lead.

Supposing that respective tips (upper left ends in FIG. 3) of the plurality of portions P1 and P2 are integral with each other, that is, the electrode lead is not divided, the respective tips of portions P1 and P2 cannot be displaced relative to each other. Therefore, portions P1 and P2 are constrained by each other and thermal stress caused by elastic deformation of the electrode lead is insufficiently relieved. A conventional electrode lead 51Z (in FIG. 13) is an example of the electrode lead that is not divided. The other end EBZ of electrode lead 51Z is not divided, although it has a through hole.

Furthermore, according to the present embodiment, the other end EB (in FIG. 3) of electrode lead 51 has portions P1 and P2 divided from each other, and the sealing resin portion separates portions P1 and P2 from each other. Portions P1 and P2 have a thermal conductivity of, for example, 400 W/m·K, and sealing resin portion 10 has a thermal conductivity of, for example, 0.5 W/m·K. Therefore, the plurality of divided portions P1 and P2 made from the material having a high thermal conductivity are provided at the other end EB, and sealing resin portion 10 made from the material having a low thermal conductivity separates these plurality of portions P1 and P2 from each other. With this configuration, a main heat transfer path is diverged and spread at the other end EB of electrode lead 51, so that heat generated at semiconductor element 4 can be dissipated. As a result, temperature distribution is further averaged, and therefore occurrence of fatigue failure in semiconductor device 100 due to thermal stress can further be suppressed.

Since electrode lead 51 has the divided portions, obstacles when sealing resin portion 10 is filled in a process of manufacturing semiconductor device 100 are decreased. As a result, sealing resin portion 10 having less voids can be formed.

In comparison with connection by aluminum wiring, electrode lead 51 can achieve stronger connection in a shorter time.

Wire portions P1C and P2C are provided separately from joining portions P1J and P2J. As a result, more sufficient cross-sectional area of electrode lead 51 can be ensured for a current flowing through electrode lead 51. Therefore, semiconductor elements 4 and 42 can be connected to circuit pattern 3 with resistance further reduced.

In addition, according to the present embodiment and the modification thereof, the influence of contraction of sealing resin portion 10 under electrode leads 51 and 52 is reduced, so that occurrence of fatigue failure in semiconductor device 100 can further be suppressed. This effect will be described hereinafter.

Figure 6A:
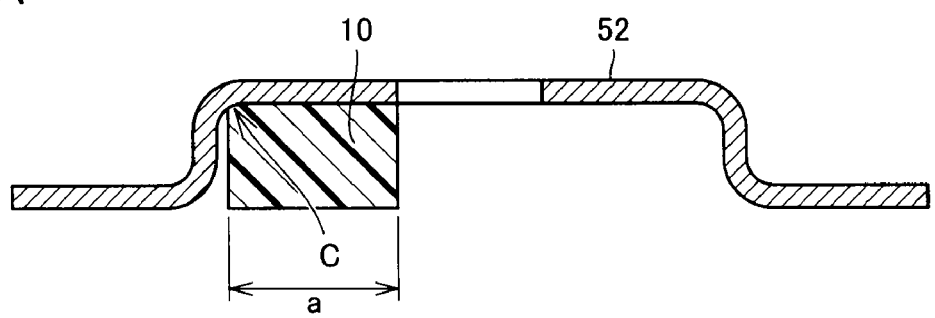
FIGS. 6A and 6B are diagrams for illustrating an action of the sealing resin portion on the electrode lead in the modification of the first embodiment of the present invention and in a comparative example, respectively.
Figure 6B:
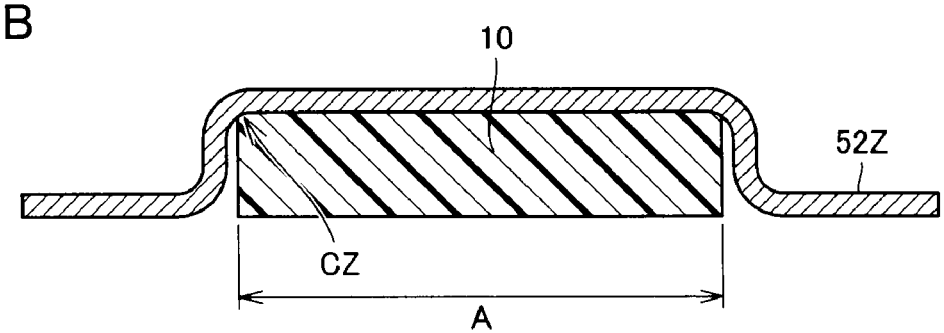

Referring to FIGS. 6A and 6B, a part of sealing resin portion 10 and the electrode lead are only shown. In a case where electrode lead 52 of the modification of the present embodiment is used (a case in FIG. 6A), contraction of sealing resin portion 10 in a portion having a width dimension "a" of one divided region under electrode lead 52 acts on a corner portion C under electrode lead 52. On the other hand, in a case where an electrode lead 52Z of a comparative example is used (a case in FIG. 6B), contraction of sealing resin portion 10 in a portion having a width dimension "A" under electrode lead 52Z acts on a corner portion CZ under electrode lead 52Z. In other words, corner portion C under electrode lead 52 is subjected to stress from sealing resin portion 10 in the region having the width dimension smaller than width dimension "A". Therefore, stress applied to corner portion C is smaller than that applied to corner portion CZ. As a result, occurrence of fatigue failure in semiconductor device 100 can further be suppressed.

Figure 7:
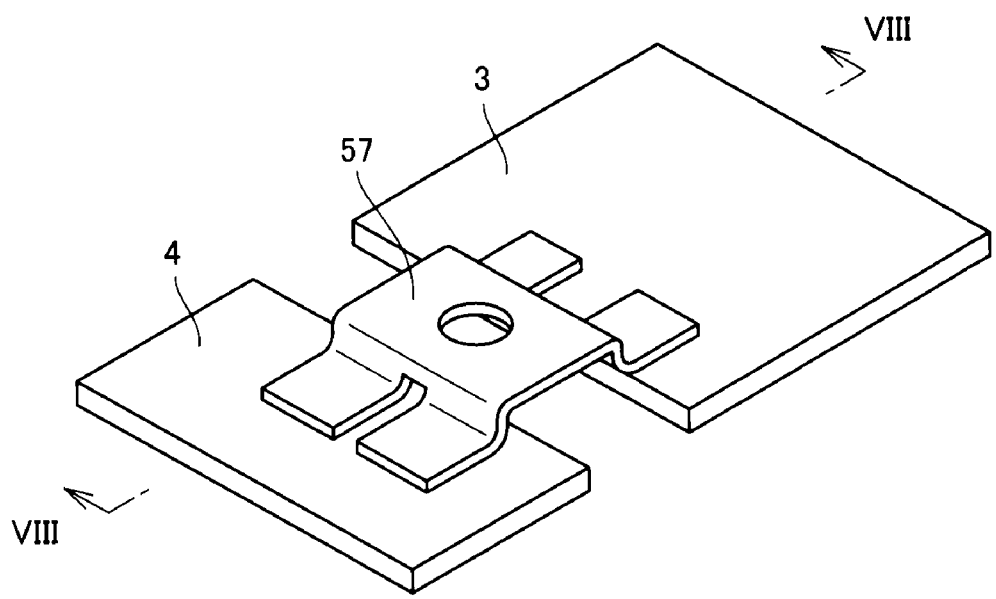
FIG. 7 is a perspective view schematically illustrating a neighborhood of an electrode lead and a semiconductor element in another modification of the first embodiment of the present invention.
Figure 8:
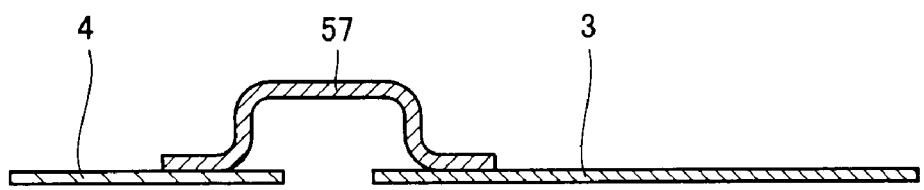
FIG. 8 is a schematic cross-sectional view taken along line VIII-VIII in FIG. 7.

In the present embodiment, although a portion made up of coupling portion P1M and joining portion P1J as well as a portion made up of coupling portion P2M and joining portion P2J are coupled to wire portions P1C and P2C divided from each other, respectively, the present invention is not limited thereto. As long as the joining portion joining with semiconductor element 4 is divided, the wire portion of the electrode lead may not be divided, for example, as seen in an electrode lead 57 (in FIGS. 7 and 8).

Figure 9:
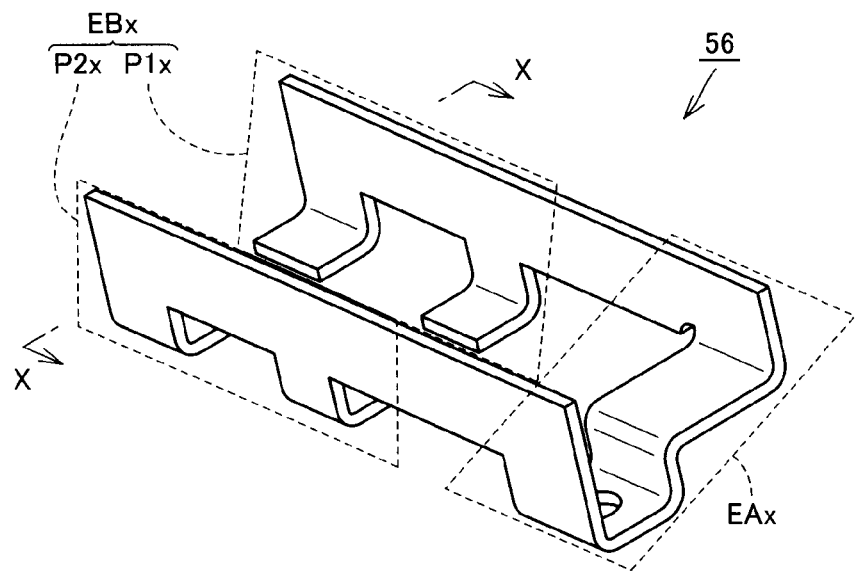
FIG. 9 is a perspective view schematically illustrating a configuration of an electrode lead of a semiconductor device in a second embodiment of the present invention.
Figure 10:
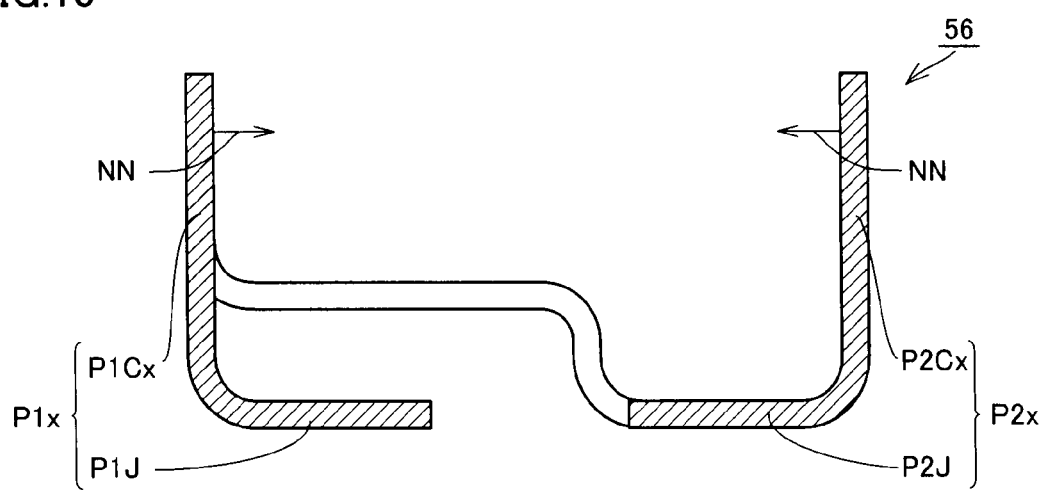
FIG. 10 is a schematic cross-sectional view taken along line X-X in FIG. 9.

Referring to FIGS. 9 and 10, an electrode lead 56 of the present embodiment has one end EAx (a lower right end in FIG. 9) and the other end EBx (an upper left end in FIG. 9). One end EAx is joined to circuit pattern 3 (not shown in FIG. 9). The other end EBx is joined by soldering to the second surface (not shown in FIG. 9) of each of semiconductor elements 4 and 42. The other end EBx has a plurality of portions P1x and P2x divided from each other. In other words, the other end EBx is divided along a boundary between portion P1x and portion P2x (a direction of division).

Portion P1x has joining portion P1J and a wire portion P1Cx as shown in FIG. 10. Joining portion P1J is joined to the second surface (the surface shown in FIG. 2) of each of semiconductor elements 4 and 42. Wire portion P1Cx extends in a direction orthogonal to the second surface of semiconductor elements 4 and 42 (vertical direction in FIG. 10).

Portion P2x also has a configuration similar to that of portion P1x as shown in FIG. 10. In other words, portion P2x has joining portion P2J and a wire portion P2Cx. Joining portion P2J is joined to the second surface (the surface shown in FIG. 2) of each of semiconductor elements 4 and 42. Wire portion P2Cx extends in a direction orthogonal to the second surface of semiconductor elements 4 and 42 (vertical direction in FIG. 10).

Wire portions P1Cx and P2Cx are plate-like portions having a direction of normal NN orthogonal to the second surface (not shown in FIG. 10) of semiconductor element 4, and are located on the upper side (upper side in FIG. 10) of electrode lead 56.

Figure 11A:
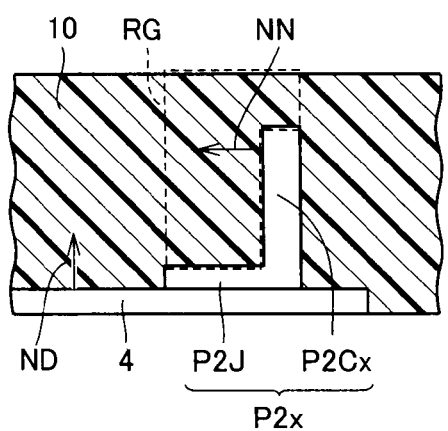
FIGS. 11A and 11B are partial cross-sectional views schematically illustrating an area around the semiconductor element and the electrode lead in the semiconductor device in the second embodiment of the present invention and in the first embodiment of the present invention, respectively.

Referring to FIG. 11A, a region RG is a region in sealing resin portion 10 separated from the second surface of semiconductor element 4 by portion P2x of electrode lead 56 of the present embodiment in a direction of normal ND to the second surface (the upper surface in the figure) of semiconductor element 4. Region RG is exposed along normal direction ND, not covered by portion P2x. In other words, sealing resin portion 10 in region RG is not surrounded by portion P2x along normal direction ND. This is because normal direction NN is orthogonal to normal direction ND, and therefore normal direction NN does not have a component in a direction opposite to normal direction ND.

Although portion P2x has been described with reference to FIG. 11A in the above, P1x can be described similarly.

Figure 11B:
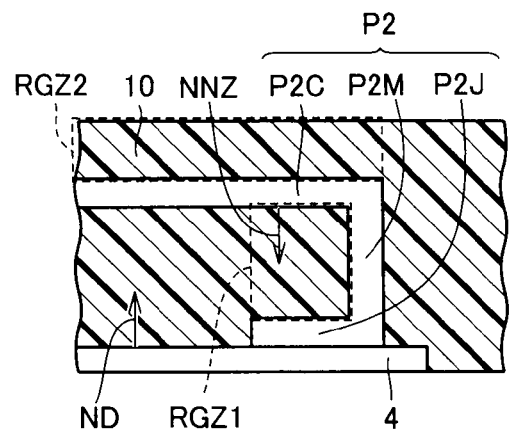

Referring to FIG. 11B, regions RGZ1 and RGZ2 are regions in sealing resin portion 10 separated from the second surface of semiconductor element 4 by portion P2 of electrode lead 51 of the first embodiment in normal direction ND to the second surface (the upper surface in the figure) of semiconductor element 4. The upper surface of region RGZ1 out of regions RGZ1 and RGZ2 is covered with wire portion P2C. In other words, region RGZ1 is not exposed along normal direction ND, covered by portion P2. Thus, sealing resin portion 10 in region RGZ1 is sandwiched between joining portion P2J and wire portion P2C along normal direction ND. As a result, opposing ends of region RGZ1 (an upper end and a lower end in FIG. 11B) are restrained by portion P2. This is because a direction of normal NNZ to wire portion P2C has a component in a direction opposite to normal direction ND.

It should be noted that the configuration is otherwise almost the same as that of the above-described first embodiment. Therefore, the same or corresponding elements are represented by the same reference characters, and the description thereof will not be repeated.

According to the present embodiment, region RG (in FIG. 11A) in sealing resin portion 10 is not surrounded by portion P2x along normal direction ND. Therefore, region RG is more likely to expand or contract freely, and sealing resin portion 10 in region RG acts less to apply stress to electrode lead 56. As a result, stress applied to electrode lead 56 is decreased, so that occurrence of fatigue failure in the semiconductor device can further be suppressed.

Figure 14:
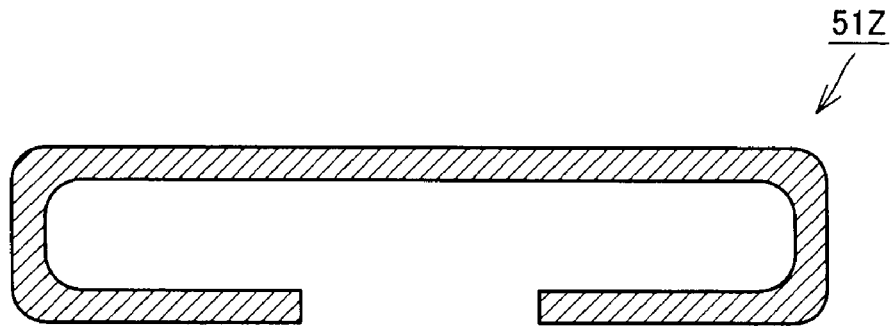
FIG. 14 is a schematic cross-sectional view taken along line XIV-XIV in FIG. 13.

Next, results of stress simulation carried out to see the effect of the present embodiment will be described. This simulation was carried out for a semiconductor device having electrode lead 56 of the present embodiment and for a semiconductor device having conventional electrode lead 51Z (in FIGS. 13 and 14). Electrode lead 51Z has one end EAZ and the other end EBZ. Both of one end EAZ and the other end EBZ are not divided.

Figure 12:
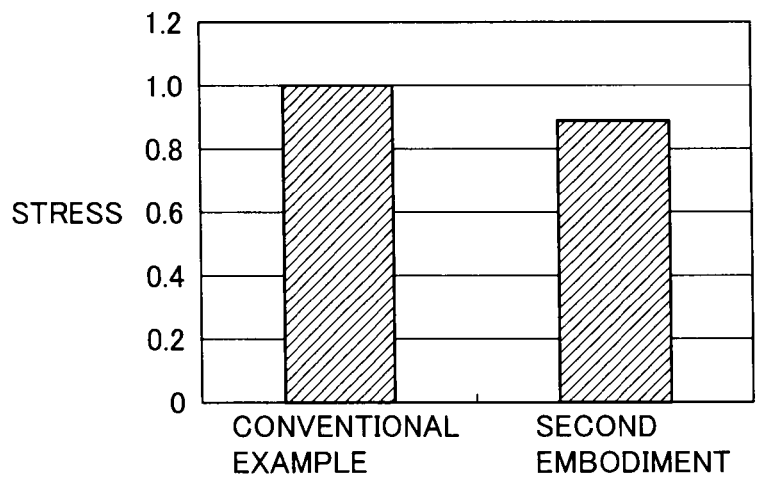
FIG. 12 is a graph illustrating stress applied to the electrode lead in the semiconductor device in the second embodiment of the present invention, and stress applied to an electrode lead in a conventional semiconductor device.

Referring to FIG. 12, when ambient temperature of the semiconductor device changed from 20° C. to 100° C., stress at the electrode joining portion of the semiconductor device of the present embodiment was 0.88, assuming that stress at an electrode joining portion of the conventional semiconductor device was 1. In other words, thermal stress was relieved by about 12%.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device, comprising:
   a substrate having a main surface on which a circuit pattern is formed;
   a semiconductor element having a first top surface and a second top surface, said first top surface being distinct from said second top surface;
   an electrode lead having a first portion joined to said circuit pattern, a second portion, and a third portion, the second portion and third portion each contacting said first top surface and said second top surface of said semiconductor element and being divided by an opening; and
   a sealing resin portion sealing said semiconductor element and said electrode lead.

2. The semiconductor device according to claim 1, wherein each of said second portion and third portion has a joining portion joined to said first top surface and said second top surface of said semiconductor element, a wire portion spaced apart from said joining portion in a direction orthogonal to said first top surface and said second top surface of said semiconductor element, and a coupling portion coupling said joining portion to said wire portion.

3. The semiconductor device according to claim 1, wherein a region in said sealing resin portion separated from said first top surface and said second top surface of said semiconductor element by said second portion and third portion in a direction perpendicular to said first top surface and said second top surface of said semiconductor element is exposed along the direction perpendicular to said first top surface and said second top surface of said semiconductor element.

4. The semiconductor device according to claim 1, wherein each of the second portion and third portion independently contacts said first top surface and said second top surface of said semiconductor element.

* * * * *